(12) United States Patent
Kemmoku

(10) Patent No.: US 7,127,311 B2
(45) Date of Patent: Oct. 24, 2006

(54) EXPOSURE APPARATUS AND DEVICE MANUFACTURING METHOD

(75) Inventor: Hiromi Kemmoku, Kanuma (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/091,595

(22) Filed: Mar. 29, 2005

(65) Prior Publication Data

US 2005/0222699 A1 Oct. 6, 2005

(30) Foreign Application Priority Data

Mar. 31, 2004 (JP) ............... 2004-106358

(51) Int. Cl.
*G06F 19/00* (2006.01)
(52) U.S. Cl. ............... 700/100; 700/99; 700/121
(58) Field of Classification Search ............... 700/99, 700/100, 117, 121
See application file for complete search history.

(56) References Cited

U.S. PATENT DOCUMENTS

| | | | | |
|---|---|---|---|---|
| 5,444,632 | A * | 8/1995 | Kline et al. ............... | 700/100 |
| 5,721,686 | A * | 2/1998 | Shahraray et al. .......... | 700/102 |
| 6,490,494 | B1 * | 12/2002 | Yasuda ....................... | 700/101 |
| 6,584,369 | B1 * | 6/2003 | Patel et al. .................. | 700/100 |
| 6,856,848 | B1 * | 2/2005 | Matsumoto et al. ........ | 700/101 |
| 6,934,931 | B1 * | 8/2005 | Plumer et al. .............. | 717/104 |
| 6,983,189 | B1 * | 1/2006 | Lu .............................. | 700/102 |
| 2001/0034563 | A1 * | 10/2001 | Matsumoto et al. ........ | 700/101 |
| 2002/0107599 | A1 * | 8/2002 | Patel et al. .................... | 700/99 |
| 2003/0063555 | A1 * | 4/2003 | Yamazaki .................... | 370/200 |
| 2003/0225474 | A1 * | 12/2003 | Mata et al. .................. | 700/121 |
| 2005/0102263 | A1 | 5/2005 | Kemmoku ..................... | 707/1 |
| 2005/0113955 | A1 * | 5/2005 | Chien .......................... | 700/101 |
| 2005/0273191 | A1 * | 12/2005 | Englhardt et al. ........... | 700/112 |
| 2006/0077365 | A1 | 4/2006 | Kemmoku .................... | 355/53 |

FOREIGN PATENT DOCUMENTS

JP 2001-307972 11/2001

* cited by examiner

*Primary Examiner*—Jayprakash N. Gandhi
(74) *Attorney, Agent, or Firm*—Fitzpatrick, Cella, Harper & Scinto

(57) ABSTRACT

An exposure apparatus having a plurality of units includes a scheduling unit which schedules a process step with respect to each lot, a combining unit which combines process steps of first and second lots, to be processed consecutively, with respect to which the scheduling unit has scheduled process steps, and a control unit which controls the plurality of units based on the process steps which are combined by the combining unit. The combining unit combines the process steps such that before completion of a process of the first lot and before loading of the second lot, a unit which is no longer used for the first lot starts a first process concerning the second lot.

11 Claims, 16 Drawing Sheets

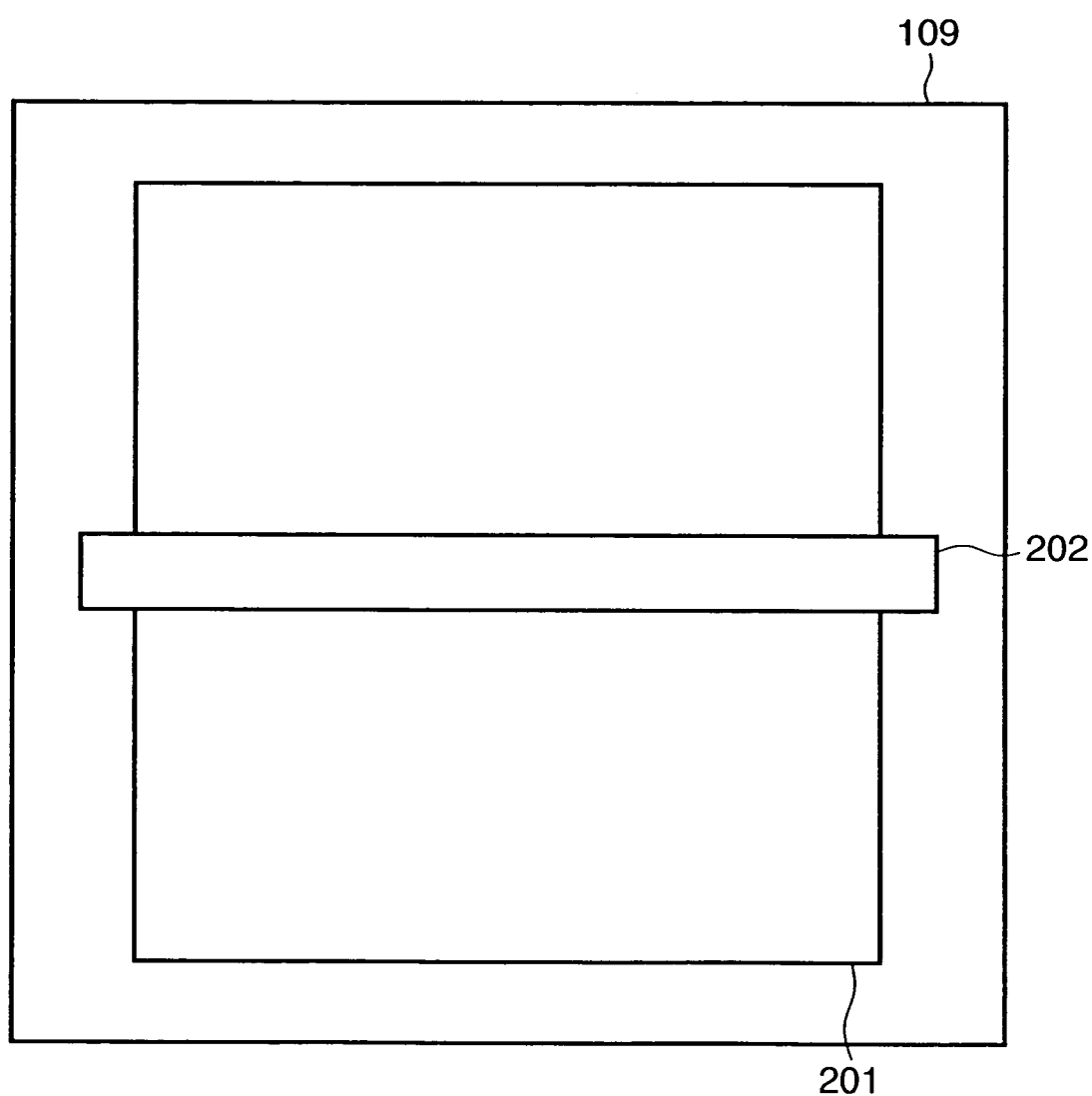

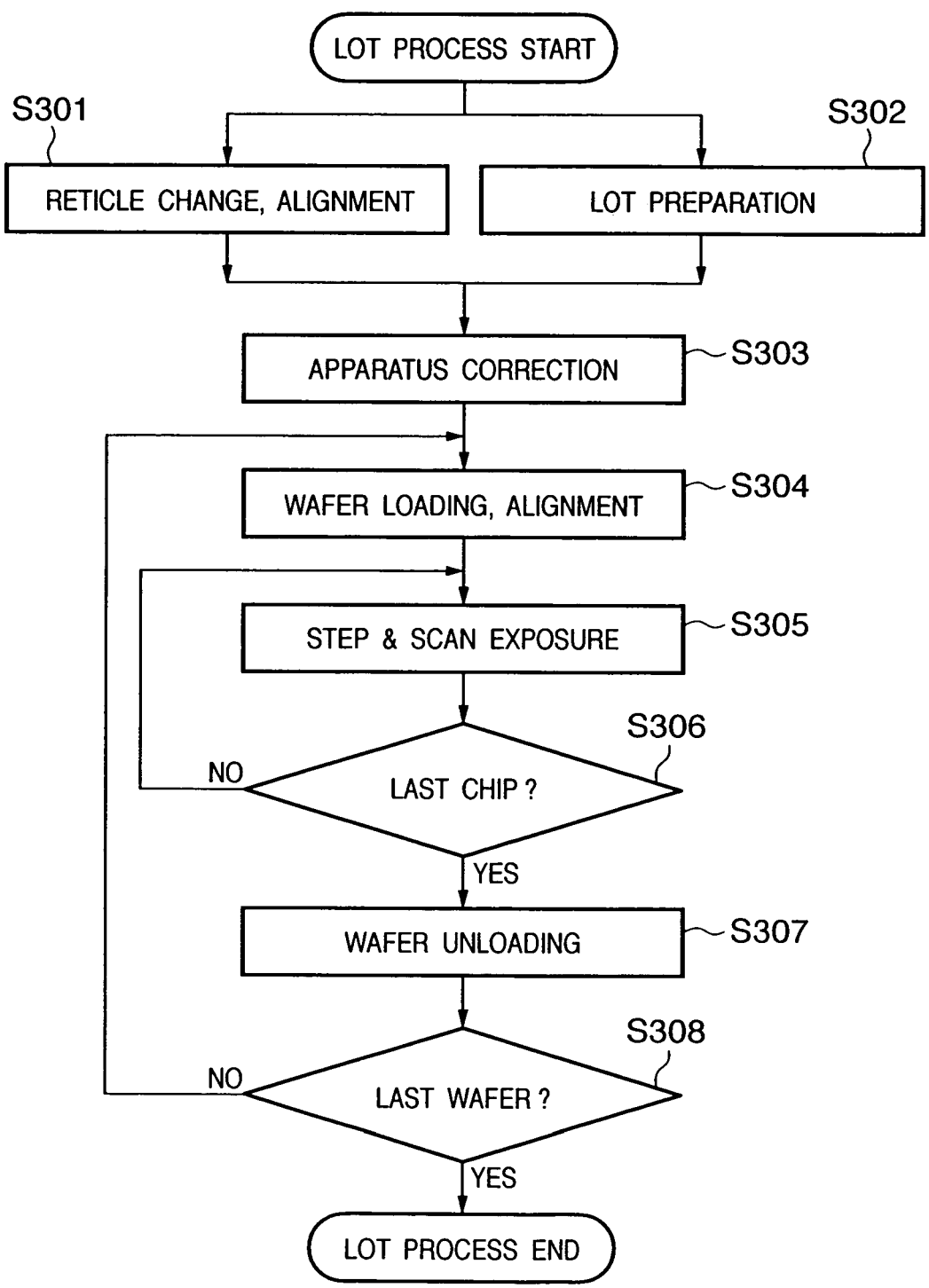

CONVENTIONAL BATCH PROCESS

PROCESS OF THE PRESENT INVENTION

FIG. 8

| STEP NAME \ UNIT NAME | WAFER STAGE | WAFER FEEDER | RETICLE STAGE | RETICLE CHANGER | LASER | ILLUMI. SYSTEM | ALIGNMENT SCOPE |
|---|---|---|---|---|---|---|---|
| RETICLE CHANGE | | | ○ | ○ | | | |
| RETICLE ALIGNMENT | | | ○ | | | | |
| LASER WAVELENGTH CALIBRATION | | | | | ○ | | |
| ILLUMINATION CONDITION SETTING | | | | | | ○ | |
| SCOPE LIGHT ADJUSTMENT | | | | | | | ○ |
| TTLAF CORRECTION | ○ | | ○ | | ○ | ○ | ○ |
| WAFER EXPOSURE | ○ | | ○ | | ○ | ○ | |
| WAFER LOADING | ○ | ○ | | | | | |
| WAFER UNLOADING | ○ | ○ | | | | | |

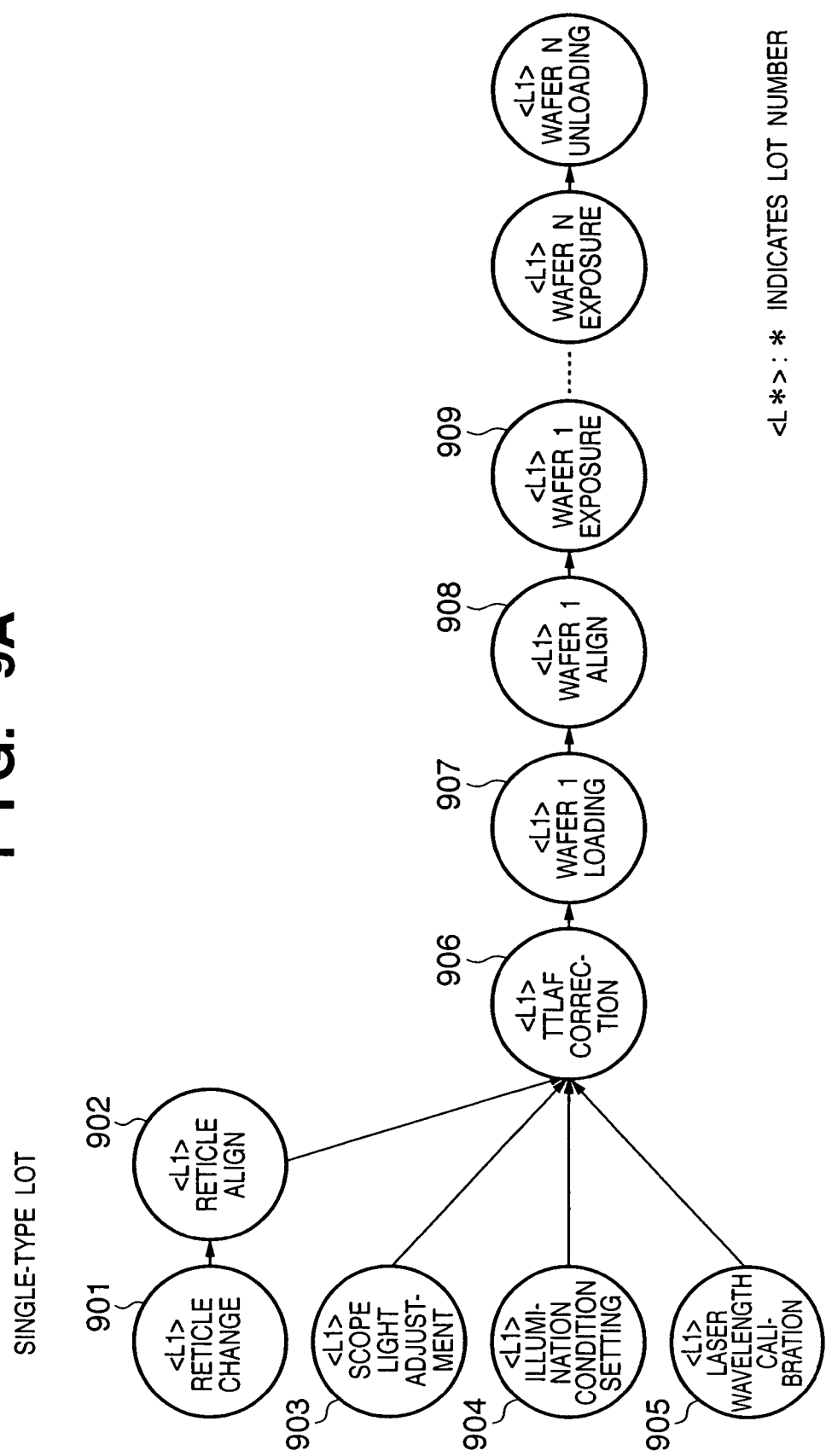

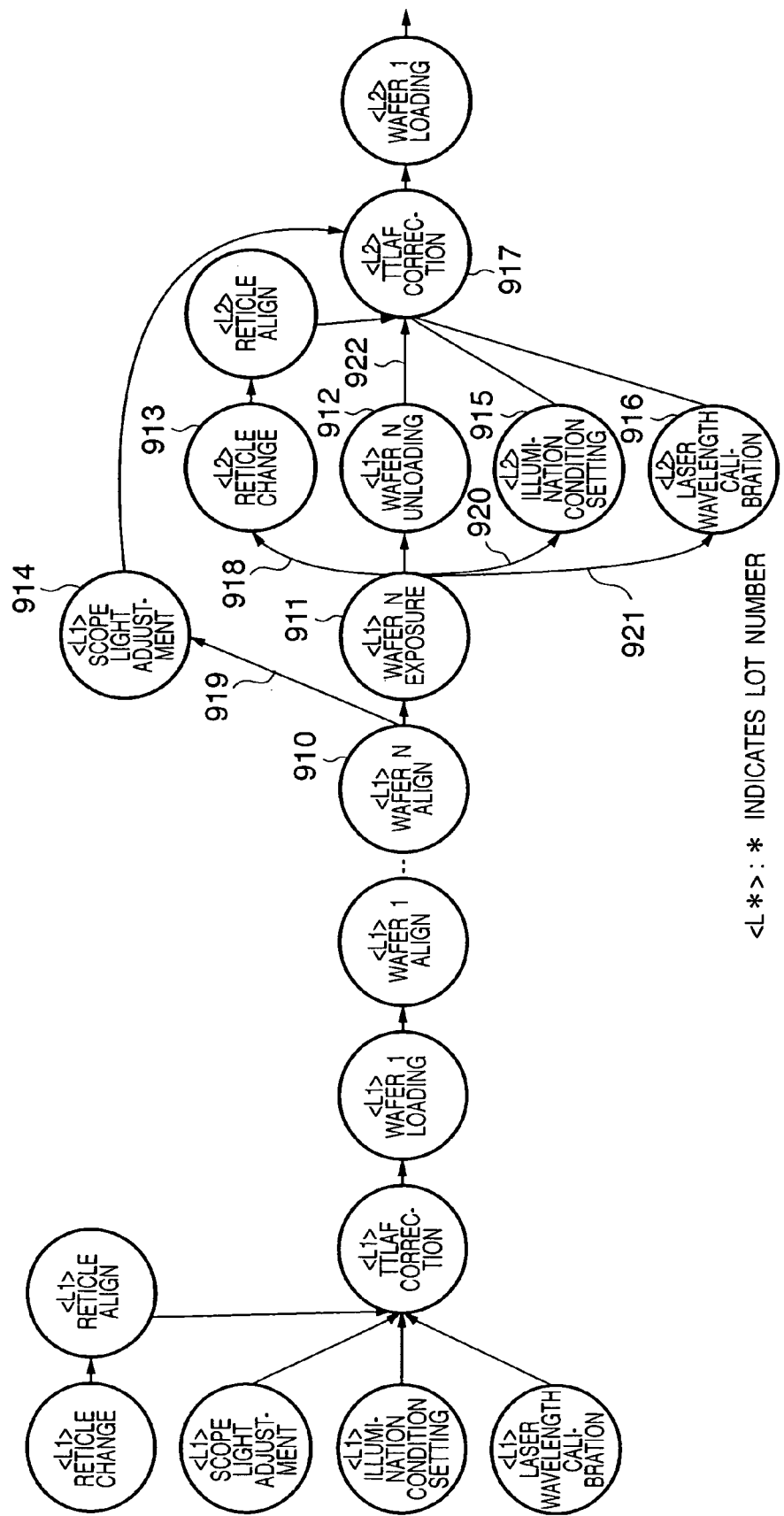

FIG. 12

| STEP NAME \ UNIT NAME | WAFER IN STATION | RETICLE STAGE | RETICLE CHANGER | LASER | ILLUMI. SYSTEM | WAFER OUT HAND | EXPO STAGE | WAFER XFER HAND | METRO STAGE | WAFER IN HAND | ALIGN-MENT SCOPE | FOCUS DETEC-TOR | WAFER OUT STATION |
|---|---|---|---|---|---|---|---|---|---|---|---|---|---|
| RETICLE CHANGE | | ○ | ○ | | | | | | | | | | |
| RETICLE ALIGNMENT | | ○ | | | | | | | | | | | |
| LASER WAVELENGTH CALIBRATION | | | | ○ | | | | | | | | | |
| ILLUMINATION CONDITION SETTING | | | | | ○ | | | | | | | | |
| TTLAF CORRECTION | | ○ | | ○ | ○ | | | | | | | | |
| SCOPE LIGHT ADJUSTMENT | | | | | | | ○ | | | | | | |
| WAFER MS LOADING | ○ | | | | | | | | ○ | ○ | | | |
| WAFER ALIGNMENT | | | | | | | | | ○ | | ○ | | |
| WAFER FOCUS | | | | | | | | | ○ | | | ○ | |
| WAFER MOVEMENT | | ○ | | ○ | ○ | | ○ | ○ | ○ | | | | |
| WAFER EXPOSURE | | | | | | | ○ | | | | | | |
| WAFER ES UNLOADING | | | | | | ○ | ○ | | | | | | ○ |

EXPOSURE APPARATUS AND DEVICE MANUFACTURING METHOD

FIELD OF THE INVENTION

The present invention relates to an exposure apparatus having a plurality of units, and a device manufacturing method using the same.

BACKGROUND OF THE INVENTION

Conventionally, the mainstream of semiconductor device production is the mass production of single-type products (single-type lots), such as DRAMs. Hence, a projection exposure apparatus frequently processes single-type lots repeatedly and keeps a continuous operation over a long period of time.

In recent years, however, many different types of specially ordered LSI products, such as ASICs, are produced in small lots more and more frequently, and the lot to be manufactured by one projection exposure apparatus is often changed in a short period of time. In this situation, an operation control scheme to process consecutive lots efficiently is required. As an example of such an operation control scheme, a batch process technique is known with which control information on a lot to be produced is reserved, and when the manufacture of a lot, which is presently being processed, is complete, the process of the next lot is started automatically based on the reserved control information.

According to the method disclosed in Japanese Patent Laid-Open No. 2001-307972, by the present applicant, before the process of a lot, which is presently being processed is complete, a substrate for the manufacture of the next lot is transported in advance to a wafer preparation completion position in accordance with the presence/absence of the recipe (control information) of the next lot. The ON/OFF state of the power supply of an exposure apparatus necessary for the lot process is controlled to suppress a time loss that occurs when lots are to be changed over.

In Japanese Patent Laid-Open No. 2001-307972, after the substrate of the next lot is transported to the wafer preparation completion position, correcting processes for various types of devices are performed. More specifically, in order to maintain a high accuracy for focusing of aligning the substrate (wafer) surface with the image-forming surface (focal plane) of a reduction projection lens and a high alignment accuracy for alignment of overlaying a pattern to be projected with a to-be-projected region, when products (lots) are to be changed over, an adjustable correction parameter is automatically measured in advance before exposure of the substrate, and the parameters of organized constituent components (units) are set at appropriate values. This prolongs a time before exposure.

In particular, to cope with recent small-feature devices, these correction parameters must be measured more accurately. Accordingly, the measurement time of the correction parameters further increases and the number of types of the correction parameters tends to increase more and more. Consequently, when the many-type, small-lot manufacture as described increases, the time required for correction parameter measurement in changing over the products (lots) increases. An efficient process is required in this respect as well.

Preprocesses of the respective units, e.g., alignment of an original (reticle) having a pattern, gas exchange of a pulse laser source, calibration of the laser beam wavelength, adjustment of the light quantity of the measurement light of a wafer alignment scope, setting of illumination conditions that optimize resolution of a mask pattern, and the like, are performed each time the lots are to be changed over. A time loss due to these processes increases as the product (lot) changeover frequency increases.

SUMMARY OF THE INVENTION

The present invention has been made in view of the above situation, and has as its exemplified object to suppress a time loss caused by a change of lots.

According to the first aspect of the present invention, there is provided an exposure apparatus having a plurality of units, comprising a scheduling unit, which schedules a process step with respect to each lot, a combining unit, which combines process steps of first and second lots, to be processed consecutively, with respect to which the scheduling unit has scheduled process steps, and a control unit, which controls the plurality of units based on the process steps which are combined by the combining unit, wherein the combining unit combines the process steps such that before completion of a process of the first lot and before loading of the second lot, a unit which is no longer used for the first lot starts a first process concerning the second lot.

According to the second aspect of the present invention, there is provided a device manufacturing method comprising steps of exposing a substrate to a pattern using the exposure apparatus described above, and developing the exposed substrate.

According to the third aspect of the present invention, there is provided a device manufacturing method of manufacturing a device using an exposure apparatus having a plurality of units, the method comprising steps of scheduling a process step with respect to each lot, combining process steps of first and second lots, to be processed consecutively, with respect to which the scheduling step has scheduled process steps, and controlling the plurality of units based on the process steps, which are combined in the combining step, wherein the combining step combines the process steps such that before completion of a process of the first lot by the exposure apparatus and before loading of the second lot to the exposure apparatus, a unit which is no longer used for the first lot starts a first process concerning the second lot.

According to the present invention, a time loss caused by changeover of lots can be suppressed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a view showing a stage wherein a mask 109 of FIG. 1 is illuminated with exposure light;

FIG. 3 is a flowchart of basic steps for a single-type lot process according to the first preferred embodiment of the present invention;

FIG. 8 is a schematic table of step unit occupation information according to the first preferred embodiment of the present invention;

FIGS. 9A and 9B are directed graphs showing step order schedule information according to the first preferred embodiment of the present invention;

DETAILED DESCRIPTION OF THE PREFERRED EMBODIMENTS

First Embodiment

Figure 1:
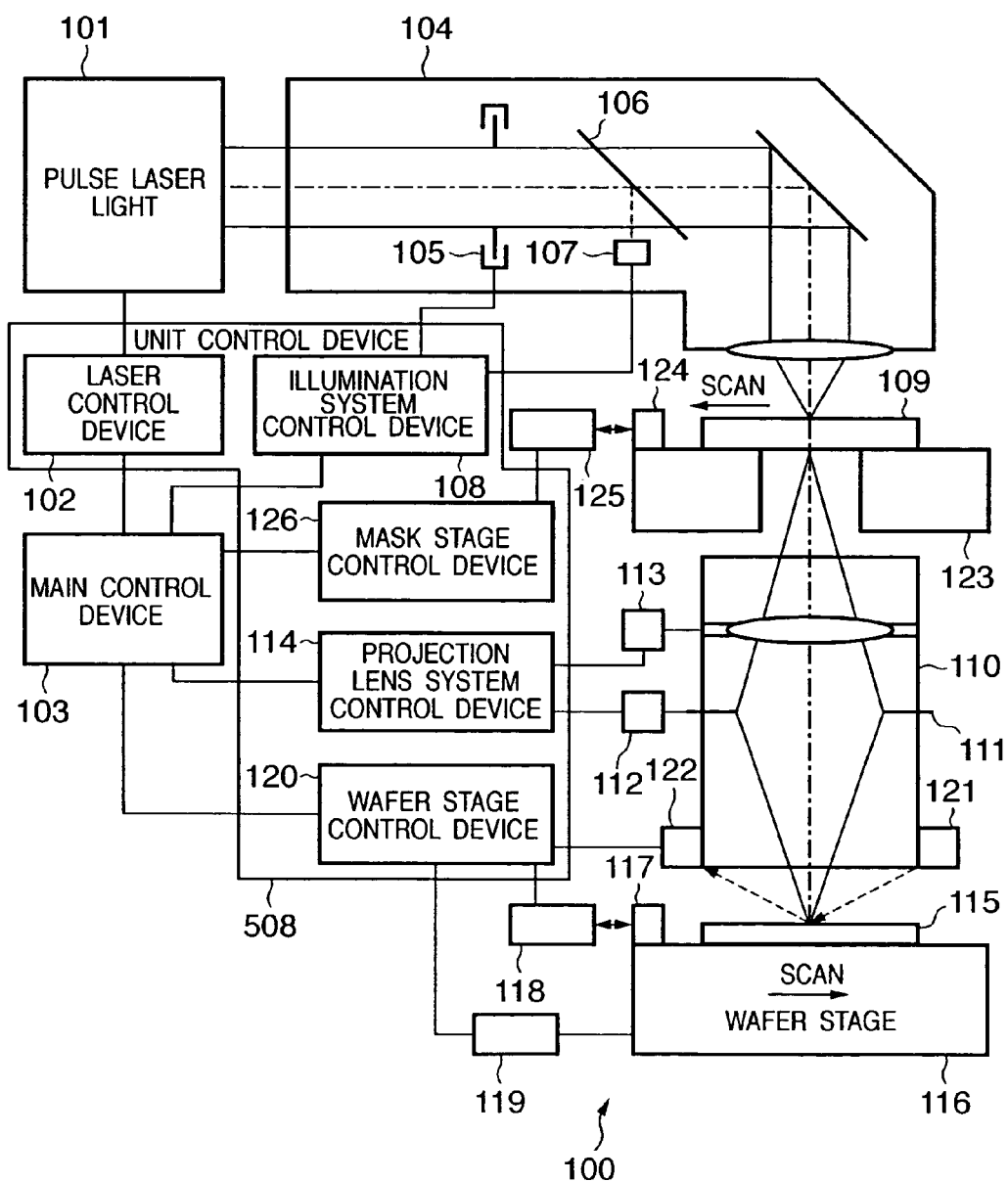
FIG. 1 is a view schematically showing the structure of a single stage type exposure apparatus according to the first preferred embodiment of the present invention.

FIG. 1 shows the schematic structure of a single stage type exposure apparatus 100 according to an embodiment of the present invention. Referring to FIG. 1, a gas, such as KrF, is sealed in a pulse laser source 101 to emit a laser beam. The pulse laser source 101 emits light having a 248-nm wavelength in a far ultraviolet region. The pulse laser source 101 has a band narrowing module including a front mirror which forms a resonator, a diffraction grating, which narrows the band of the exposure wavelength, a prism, and the like, a monitor module including a spectroscope or detector, which monitors the stability and spectral width of the wavelength, and the like, a shutter, and the like. A laser control device 102 controls the gas exchange operation, wavelength stabilization operation, discharge and application of voltage, and the like, of the pulse laser source 101. According to this embodiment, single control by the laser control device 102 is not performed, but control is performed in response to an instruction from a main control device 103 for the entire exposure apparatus 100, which is connected through an interface cable. However, the present invention is not limited to this.

The beam emitted from the pulse laser source 101 is shaped into a predetermined beam shape through a beam shaping optical system (not shown) in an illumination optical system 104, and enters an optical integrator (not shown) to form a large number of secondary light sources which illuminate a mask 109 (to be described later) with a uniform illuminance distribution. The opening of an aperture stop 105 of the illumination optical system 104 is substantially circular. The diameter of the opening of the aperture stop 105 and the numerical aperture (NA) of the illumination optical system 104 can be set to desired values by an illumination system control device 108. In this case, because the ratio of the numerical aperture of the illumination optical system 104 to the numerical aperture of a reduction projection lens 110 (to be described later) serves as a coherence factor (value α), the illumination system control device 108 can set the value α by controlling the aperture stop 105 of the illumination optical system 104. A half mirror 106 is arranged on the optical path of the illumination optical system 104 to reflect and extract part of the exposure light that illuminates the mask 109. An ultraviolet photosensor 107 is arranged on the optical path of the beam reflected by the half mirror 106, and generates an output corresponding to the intensity (exposure energy) of the exposure light. The output from the photosensor 107 is converted into an exposure energy per pulse by an integration circuit (not shown), which integrates each pulse emitted by the pulse laser source 101, and is input to the main control device 103, which controls the main body of the exposure apparatus 100, through the illumination system control device 108.

The reticle (or mask) 109 has the circuit pattern of a semiconductor device to be printed. The reticle 109 is irradiated with the exposure light by the illumination optical system 104. A variable blind (not shown) has a light-shielding plate arranged on a plane perpendicular to the optical axis of the variable blind, so that the irradiation region of the circuit pattern surface of the mask 109 can be set arbitrarily. FIG. 2 shows a stage wherein the exposure light illuminates the mask 109. Part of a circuit pattern 201 of the mask 109 is slit-illuminated by a slit beam 202 to be reduced and exposed on a wafer 115 coated with a photoresist through the projection lens 110, shown in FIG. 1, at a reduction ratio β (e.g., β—1/4). As indicated by arrows (Scan) in FIG. 1, while the mask 109 and wafer 115 are scanned in opposite directions with respect to the projection lens 110 and slit beam 202 at the same speed ratio as the reduction ratio β of the projection lens 110, pulse exposure by pulse emission from the pulse laser source 101 is repeated, so that the circuit pattern 201 on the entire surface of the mask 109 can be transferred onto one chip region or a plurality of chip regions on the wafer 115.

An aperture stop 111, having a substantially circular opening, of the projection lens 110 is arranged on the pupil plane (Fourier transform plane for the reticle) of the projection lens 110. When the diameter of the opening is controlled by a driving unit 112, such as a motor, the numerical aperture (NA) of the projection lens 110 can be set at a desired value. A field lens driving device 113 moves a field lens, which constitutes part of a lens system in the projection lens 110, along the optical axis of the projection lens 110 using pneumatic pressure, a piezoelectric element, or the like. Thus, a projection magnification and distortion error can be improved while preventing degradation of various types of aberrations of the projection lens 110.

A wafer stage 116 is movable in a three-dimensional direction and can move in the direction of the optical axis (Z direction) of the projection lens 110 and within a plane (X-Y plane) perpendicular to the direction of the optical axis of the projection lens 110. The X-Y plane position of the wafer stage 16 is detected by causing a laser interferometer 118 to measure a distance to a moving mirror 117 fixed to the wafer stage 116. A wafer stage control device 120 under the control of the main control device 103 of the exposure apparatus 100 detects the position of the wafer stage 116 by the laser interferometer 118 and controls a driving unit 119, such as a motor, to move the wafer stage 116 to a predetermined position on the X-Y plane. Regarding focal plane detection unit 121 and 122, the projection optical system 121 projects a plurality of beams including non-exposure light that does not photosensitize the photoresist on the wafer 115, and the detection optical system 122 detects the beams focused on and reflected by the wafer 115, so that the focal plane is detected. Although not shown, a plurality of position-detection light-receiving elements are arranged in the detection optical system 122 to correspond to the respective reflected beams. The light-receiving surfaces of the respective position-detection light-receiving elements and the respective beam-reflecting points on the wafer 115 are made substantially conjugate by an imaging optical system. A positional shift of the wafer surface in the direction of the optical axis of the projection lens 110 is measured as a positional shift of the incident beam on the position-detection light-receiving element in the detection optical system 122.

According to this embodiment, after the mask 109 and wafer 115 are aligned to establish a predetermined relationship, the laser control device 102, the wafer stage control device 120, and a mask stage control device 126 scan-expose the circuit pattern 201 on the entire surface of the mask 109 to transfer the circuit pattern 201 to the chip region on the wafer 115 based on sync signals from the main control device 103. After that, a step and scan exposure process, of driving the wafer 115 with the wafer stage 116 by a predetermined amount in the X-Y plane and sequentially projecting and exposing the other regions of the wafer 115 in the same manner, is performed.

Figure 6:
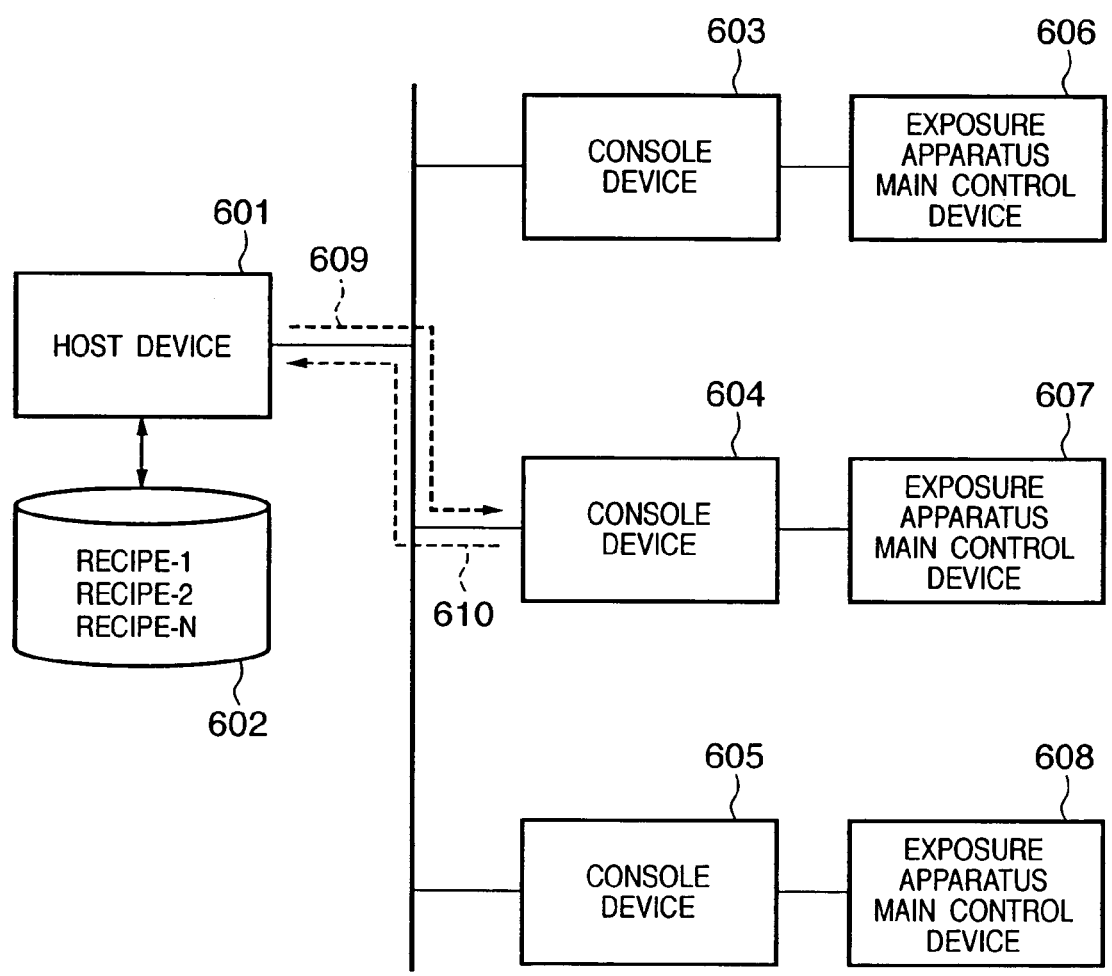
FIG. 6 shows the device configuration of a semiconductor manufacturing process which uses an exposure apparatus according to the preferred embodiment of the present invention.

FIG. 6 shows an example of the device configuration used in a semiconductor manufacturing process that uses an exposure apparatus. Referring to FIG. 6, a host device 601, which manages a plurality of projection exposure apparatuses, is connected to a hard disk drive 602. The hard disk drive 602 contains a database, which holds recipes (control information) in which exposure process conditions are set in detail in accordance with products. Each of main control devices 606, 607, and 608 of the exposure apparatuses corresponds to the main control device 103 of the exposure apparatus 100 shown in FIG. 1. Each of console devices 603, 604, and 605 are connected to the main control devices 606, 607, and 608 in one-to-one correspondence. The operator can control the respective units of the exposure apparatuses through the individual console devices 603, 604, and 605. The host device 601 and the respective main control devices 606, 607, and 608 are online-connected by a network communication mechanism through the attached console devices 603, 604, and 605, so that centralized apparatus control by the host device 601 is possible. Although the latter online apparatus control through the host device 601 will be described as an example in this embodiment, the present invention is not limited to this.

Online communication 609 indicates product lot process demands, which are to be transferred from the host device 601 to the respective console devices 603, 604, and 605, and shows the flow of data when reserving a product lot exposure process with the exposure apparatuses. Online communication 610 shows the flow of data when notifying the operation states of the main control devices 606, 607, and 607 of the respective exposure apparatuses and the lot process reservation states (described above) to the host device 601. The host device 601 performs centralized control of the exposure apparatuses by these online communications.

Figure 7:
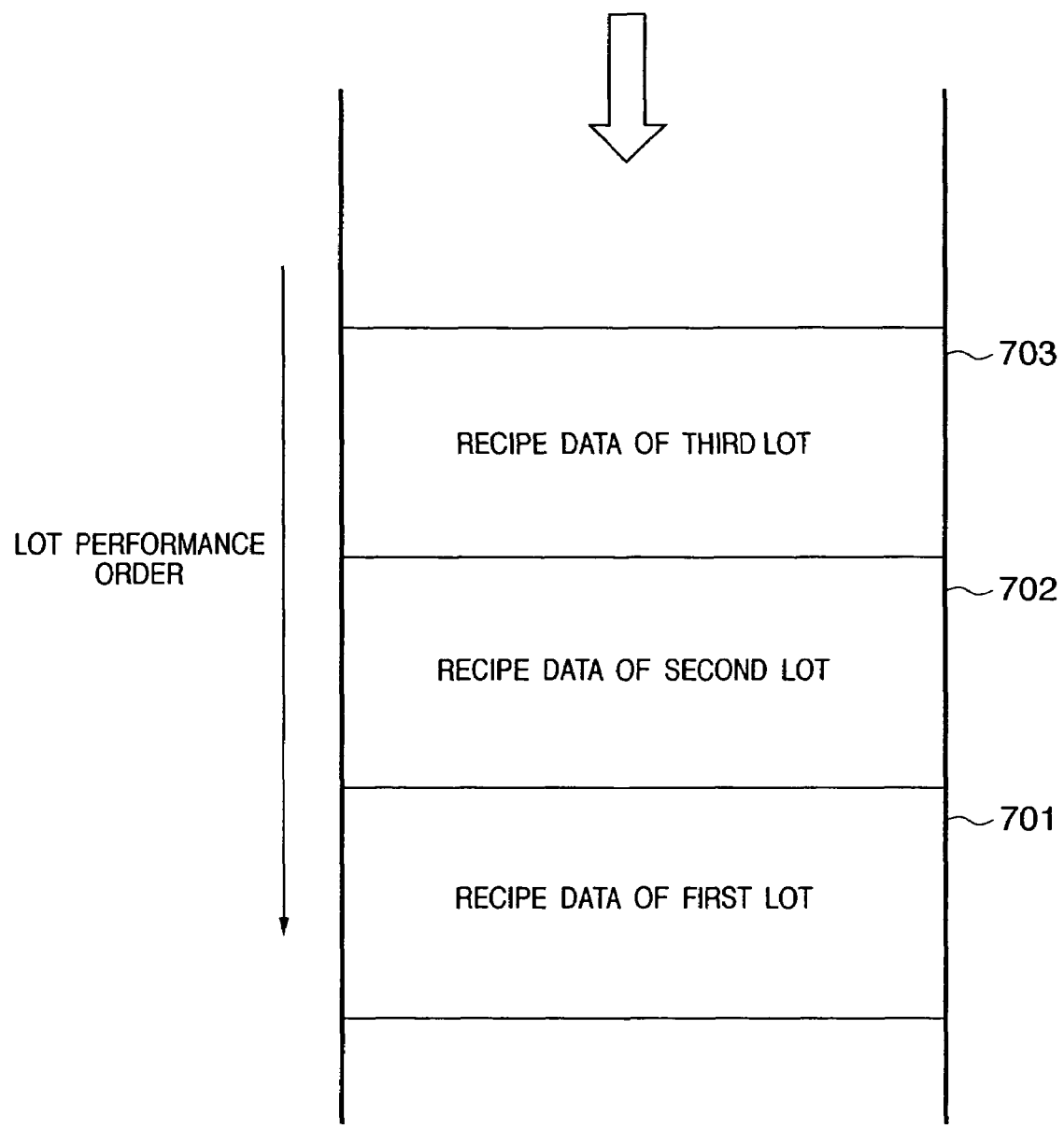
FIG. 7 shows a data string held by a lot queue according to the preferred embodiment of the present invention.

When a product lot is to be subjected to an exposure process, the operator creates a recipe according to the type of the product by the host device 601, attaches a recipe name (e.g., Recipe-1, Recipe-2, . . . , or Recipe-N) to the recipe, and stores it in the hard disk drive 602. When the preparation for the production of the products by the exposure apparatuses is complete, a stored product recipe name is selected from the hard disk drive 602, and an exposure apparatus (not shown) to be used is designated. The host device 601 transfers the recipe data to the console device (console device 604 in FIG. 6) connected to the main control device (main control device 607 in FIG. 6) of the designated exposure apparatus through the broadband type online communication 609. The console device 604, which has received the recipe data, inserts the recipe data at the end of the lot queue shown in FIG. 7. In the case of FIG. 7, the recipe data are stored in the order of lot demands 701, 702, and 703. The exposure apparatus sequentially performs the exposure apparatus until the recipe data stored in the form of the lot queue are used up.

FIG. 3 is a flowchart schematically showing a series of steps, which are performed by the exposure apparatus 100, when a single-type lot is to be processed. Steps S301 to S303 correspond to a preprocess, which is performed before the first wafer 115 in the next lot is transported. When the lot process is started, first, the exposure apparatus 100 stars the operations of steps S301 and S302 in a parallel manner.

In step S301, the mask 109 to be used for lot production is transported to a mask stage 123 by a mask hand (not shown). The mask stage 123 is positioned while observing the positions of the mask 109 and mask stage 123 relative to each other using a mask alignment scope (not shown).

In step S302, preparation for constituent components (units), which can be performed in a parallel manner with step S301, is performed. For example, gas exchange of the pulse laser source 101, calibration of the laser beam wavelength, adjustment of the light quantity of the measurement light of the wafer alignment scope (not shown), setting of illumination conditions that optimize resolution of the mask pattern, and the like, are performed in a parallel manner. With this illumination condition setting, the numerical aperture (NA) of the projection lens 110 and the coherence factor (value $\alpha$) 105 of the illumination optical system are controlled to meet the designated conditions. When unit control of each of steps S301 and S302 is ended, the flow advances to step S303.

In step S303, an apparatus correction process is performed to maintain the processing accuracy of the wafer 115. One of the typical apparatus correction processes is a process performed by a through-the-lens autofocus system (TTLAF) (not shown), which measures the focal plane by light passing through the projection lens 110. According to this process, the amount by which the focal plane of the projection lens 110 shifts from the designed position by exposure heat, or the like, is measured, and the image surface is corrected such that the focal plane and the wafer surface coincide with each other.

In step S304, the wafer 115 is loaded onto the wafer stage 116 by a wafer hand (not shown). The mask 109 and wafer 115 are aligned relative to each other while observing an alignment mark on the wafer 115 by the wafer alignment scope (not shown).

In step S305, after the wafer stage 116 is stepped to a chip exposure start position in the X-Y plane by a predetermined amount, scan exposure is performed by the pulse laser source 101 while scanning the mask stage 123 and wafer stage 116 in a sync manner. The preprocess of steps S301 to S303 has been ended before transporting the substrate of the next lot. Thus, scan exposure can be started immediately after the substrate of the next lot is loaded.

In step S306, when exposure of all chips on the wafer is ended, whether or not exposure of the last chip is ended is checked. If exposure of the last chip is ended ("YES" in step S306), the flow advances to step S307. If exposure of the last chip is not yet ended ("NO" in step S306), the flow returns to step S305.

In step S307, the wafer is unloaded by the wafer hand (not shown).

In step S308, when exposure of all wafers of the lot is ended, whether or not exposure of the last wafer is ended is checked. If exposure of the last wafer is ended ("YES" in step S308), the lot process is ended.

If exposure of the last wafer is not yet ended ("NO" in step S308), the flow returns to wafer loading step S304. The process of steps S304 to S308 is repeated until exposure of the last wafer is ended.

The process of steps S301 to S308 described above can be performed by a single unit or a combination of the operations of a plurality of units.

Figure 4A:
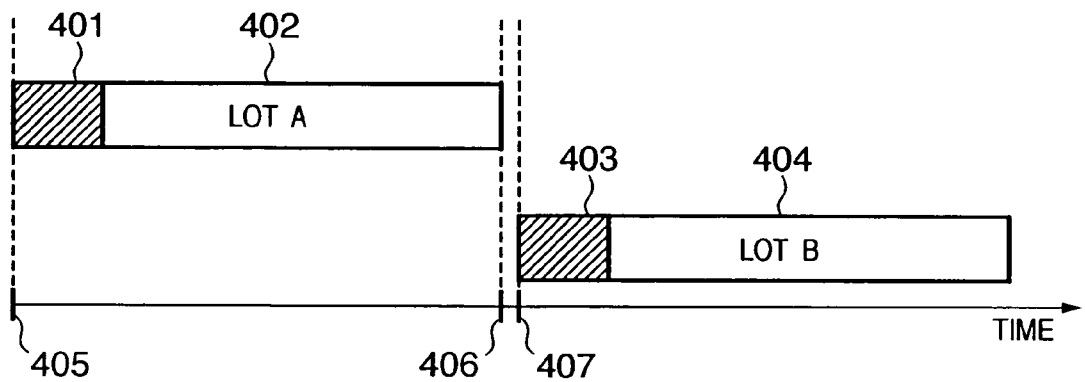
FIGS. 4A and 4B are lot process timing charts according to the first preferred embodiment of the present invention.
Figure 4B:
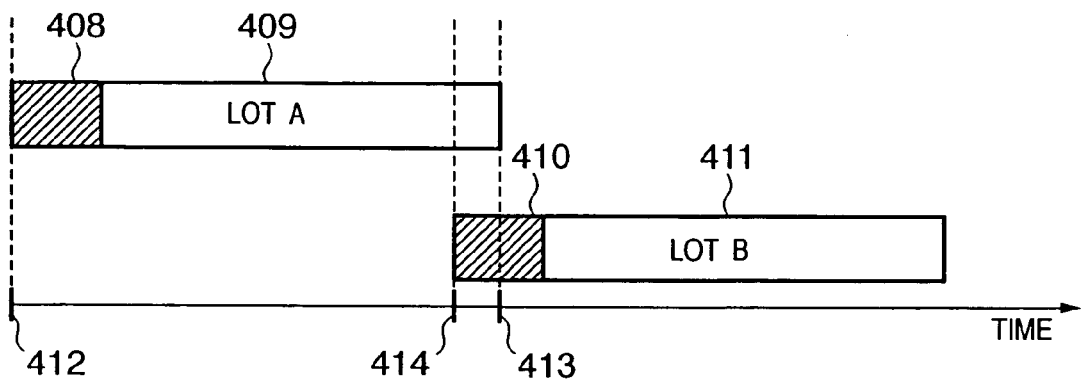

FIG. 4A is a timing chart showing a case wherein two lots, i.e., single-type lots A and B, are processed consecutively using the conventional batch process technique. The lot A is started at time 405 and ended at time 406. After the lot A is changed over to the lot B, the lot B is started at time 407. Elements 401 and 403 correspond to the lot preparation process of steps S301 to S303 shown in the series of basic steps, which are performed by the exposure apparatus 100 of FIG. 3. Elements 402 and 404 correspond to the process of substrate loading to unloading of steps S304 to S308 of FIG. 3. In this manner, in the conventional exposure process, when the lot A is to be changed over to the lot B, a time loss occurs between time 406 and time 407, and the lot A cannot be consecutively changed over to the lot B. In contrast to this, according to the preferred embodiment of the present invention, before the exposure process of the lot A is ended at 406, the subsequent lot B is started at 414. Thus, the lot A can be consecutively changed over to the lot B. As shown in FIG. 4B, when the process of the lot B is started before the previous lot is ended, the time loss that occurs during lot changeover can be suppressed.

Figure 5:
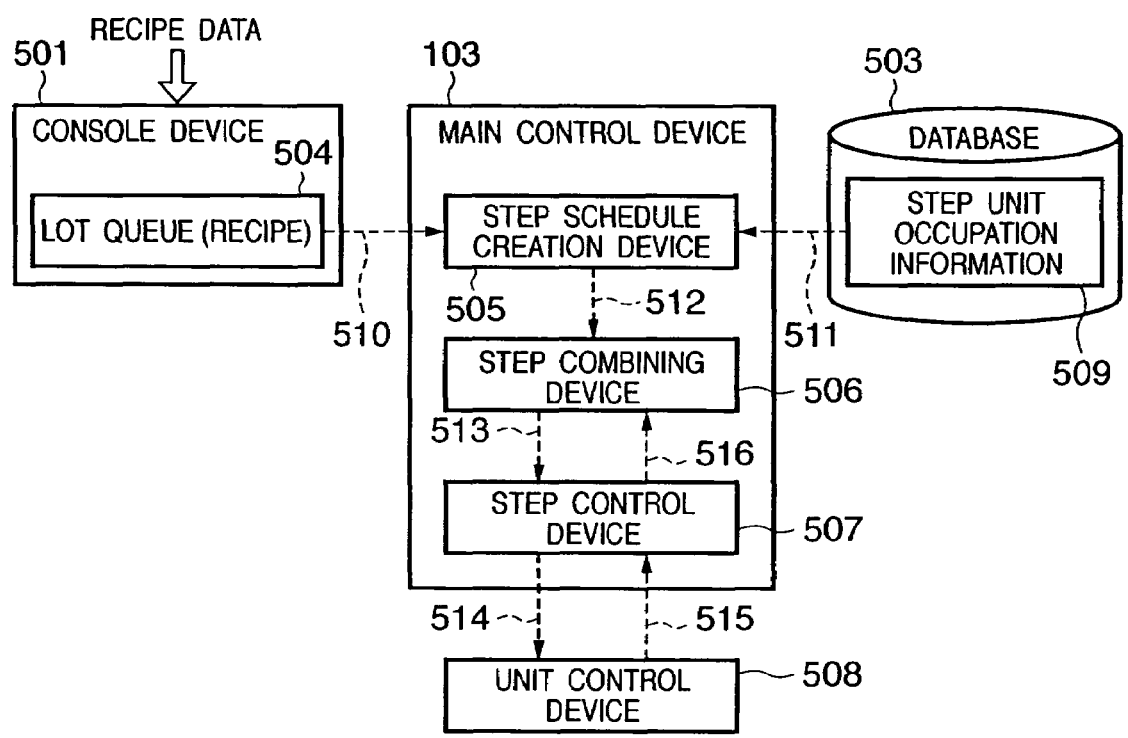
FIG. 5 is a view showing a system configuration according to a preferred embodiment of the present invention.

A step order scheduling method, which is one of the most characteristic methods of the present invention, of starting the step of a subsequent lot before the previous lot is ended, when a unit controlled by the preceding lot becomes empty, without waiting for the end of the previous lot, and a method of controlling the operation based on the step order schedule, will be described. FIG. 5 is a schematic view showing a system configuration according to a preferred embodiment of the present invention. This system includes a console device 501 identical to that described above, a main control device 103, and a database 503, which stores a lot process step table for an exposure apparatus 100. The console device 501 stores recipe data transmitted from a host device in a lot queue (recipe) 504 and transmits it to a step scheduling device 505 of the main control device 103 (510). The step scheduling device 505 as a scheduling unit creates step order schedule information including the step order of the exposure process based on the exposure conditions, e.g., the number of wafers to be processed and illumination conditions, which are set by the recipe data, and information (step unit occupation information) 509, which is stored in the database in advance and indicates the constituent components (units) to be occupied by each step of the exposure process, to schedule the process steps of each lot (512).

FIG. 9A is a diagram showing the step order schedule information of a single-type lot created by the step scheduling device 505 in the form of a directed graph. Nodes in circles indicate the step names of the exposure apparatus 100, and branches indicated by arrows represent the action orders of the respective steps. Nodes without input arrows mean that the designated processes can be performed any time. Processes of steps 901, 903, 904, and 905 can be performed in a parallel manner. A node with an input arrow, e.g., step 906 can be started when all previous steps 902, 903, 904, and 905 are ended and no input arrow is left.

FIG. 9A shows the step order schedule information for a case wherein N wafers are exposed in the process flow for a single-type lot described with reference to FIG. 3. FIG. 9A will be described through comparison with FIG. 3. Reticle change and alignment of step S301 corresponds to two steps, i.e., reticle change step 901 and reticle alignment 902. Lot preparation of step S302 corresponds to three steps, i.e., scope light adjustment 903, illumination condition setting 904, and laser wavelength calibration 905. Apparatus correction of step S303 corresponds to TTLAF correction step 906. When the lot process is started, reticle change step 901, wafer alignment scope light adjustment step 903, illumination condition setting step 904, and laser wavelength calibration step 905 can be started simultaneously. This is because units which are occupied do not overlap between the respective steps. When reticle change step 901 is ended, reticle alignment step 902 is started. TTLAF correction step 906 is started after reticle alignment step 902, scope light adjustment step 903, illumination condition setting 904, and laser wavelength calibration 905 are all ended. After that, steps of Wafer loading 907, Wafer alignment 908, and Wafer exposure 909 are performed after the previous step is ended. This process is repeatedly performed until the N wafers are processed.

Referring back to FIG. 5, a step combining device 506 serving as a combining unit combines the step order schedule information (process steps) of the first and second consecutive lots based on the step order schedule information created by the step scheduling device 505. A step control device 507 serving as a control unit performs steps (nodes) that can be performed in accordance with the step order schedule information (process steps) combined by the step combining device 506, to control the exposure apparatus. The step control device 507 controls the operation while designating appropriate parameters to a plurality of lower-level unit control devices 508, which are used to perform the steps. The unit control devices 508 include control devices, such as the laser control device 102, illumination system control device 108, mask stage control device 126, projection lens system control device 114, and wafer stage control device 120. When the designated operation is ended, the unit control devices 508 send back an end notification 515 to the step control device 507. Upon reception of the end notification from the unit control devices 508, the step control device 507 deletes arrows (branches) pointing the step (node) of the step order schedule information and the next step. If a step (node) that can be performed exists, it is performed repeatedly to advance the lot process.

An example will be described wherein when two lots are to be consecutively processed with reference to the single-type lot process as described above, the process of the subsequent lot is started before the previous lot is ended without waiting its end, to suppress a time loss caused by a lot changeover. When the recipe data of the second lot is transferred, the step scheduling device 505 creates the step order schedule information of the second lot with the same procedure as that of the single-type lot described with reference to FIG. 9A. At this stage, step order schedule information for the first lot (possible even during performance) and that for the second lot are created independently of each other.

Subsequently, the step combining device 506 combines the two pieces of step order schedule information using the step unit occupation information 509 to suppress the time loss between the lots. FIG. 8 is a table showing an example of the step unit occupation information 509. In the table of FIG. 8, step names 801 are arranged on horizontal rows, and constituent component names (unit names) 802 are arranged on vertical columns. Circles marked in the table of FIG. 8 indicate units occupied when a corresponding step is performed. Reticle change step on the first row occupies the unit of a reticle stage 123 and the unit of a reticle changer (not shown) which transports a reticle. Information on the units used in the respective steps of the exposure apparatus 100 can be obtained by referring to the step unit occupation information 509.

FIG. 9B is a diagram showing an example in which pieces of step order schedule information of the two lots are combined with reference to the step unit occupation information 509 of FIG. 8. First, a method of combining the start step of the subsequent lot (second lot) to the previous lot (first lot) will be described. As shown in FIG. 8, wafer unloading step 912 as the last step of the first lot occupies the unit of Wafer Stage and the unit of Wafer Feeder. Regarding respective steps 913, 914, 915, and 916, which correspond to the start steps of the second lot, pieces of information on units occupied by the respective steps are obtained from FIG. 8. It is checked whether or not units to be occupied overlap between first lot last step 912 and second lot start step 913, between steps 912 and 914, between steps 912 and 915, and between steps 912 and 916. In this case, no unit overlaps between first lot last step 912 and any one of second lot start steps 913, 914, 915, and 916, and accordingly, a simultaneous process (the process of the second lot is started before the first lot is ended), can be performed. Then, whether or not occupied units overlap between wafer exposure step 911 as a step which precedes last step 912 of the first lot by one step and the second lot start step is checked. As the units occupied by wafer exposure step 911 of the first lot and the units occupied by each of steps 913, 915, and 916 of the second lot overlap, step 911 and steps 913, 915, and 916 are combined by order branches 918, 920, and 921, which are started after step 911 is ended. Then, wafer alignment step 910, which precedes by one step and scope light adjustment step 914 of the second lot, are compared. As some occupied units overlap between these steps, step 914 of the second lot is started after step 910 of the first lot is ended (919).

A method of combining the end step of the previous lot (first lot) to the subsequent lot (second lot) will be described. In the same manner as in the combining method described above, occupation unit information of wafer N unloading step 912 as the last step of the first lot is sequentially compared with those of the second lot starting with the start step. In the sequential advance of the steps of the second slot, if occupied units overlap, the steps where overlapping occurs are combined. In the case of FIG. 9B, Wafer Stage overlaps between the wafer N unloading step 912 of the first lot and TTLAF correction step 917 of the second lot, and accordingly, steps 912 and 917 are combined (922). Thus, the combined step order schedule information is updated. The operation of the exposure apparatus 100 is controlled with the step order schedule information in the same manner as that described above with reference to FIG. 5.

FIG. 4B is a timing chart of a case wherein the lots A and B are consecutively performed in the preferred embodiment of the present invention. The lot B is started (414) before end time 413 of the lot A. This overlap occurs because steps 914, 913, 915, and 916 of the subsequent lot shown in FIG. 9 are started before the previous lot is ended. It is obvious that production preparation steps, which occur when changing over the lots, are started before the previous lot is ended, and a time required for product lot production is shortened.

Second Embodiment

The first embodiment exemplifies the single stage type exposure apparatus 100, which sequentially performs processes using one wafer stage 116, which shares the wafer alignment step and the wafer exposure step. The second embodiment describes a twin stage type exposure apparatus 100, which performs a wafer measurement step, such as wafer alignment and wafer focus plane measurement by a measurement stage, and a wafer exposure process by an exposure stage using independent stages.

Figure 10:
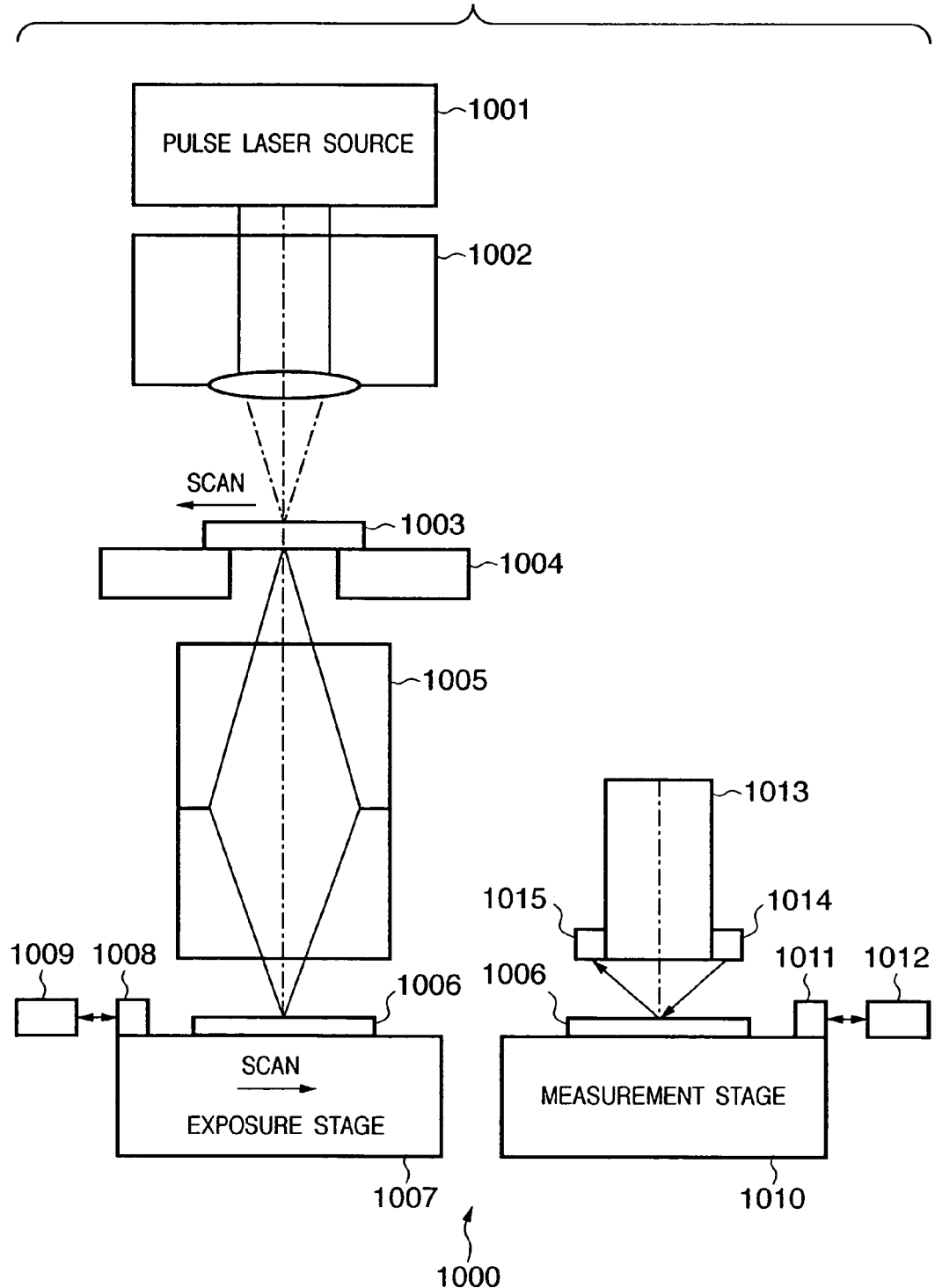
FIG. 10 shows the schematic structure of a twin stage type exposure apparatus according to the second preferred embodiment of the present invention.

FIG. 10 is a view showing the schematic structure of the twin stage type exposure apparatus 1000 according to the second embodiment of the present invention. Referring to FIG. 10, a pulse laser source 1001, an illumination optical system 1002, a mask stage 1004, projection lens 1005, and an exposure stage 1007 form the same structure as that of the single stage type exposure apparatus 100. In the production of a product lot, a wafer 1006 transported to the exposure state 1007 is subjected to a step and scan type exposure process.

A measurement stage 1010 is movable in a three-dimensional direction and can move in the direction of the optical axis (Z direction) of the projection lens 1005 and within a plane (X-Y plane) perpendicular to the direction of the optical axis of the projection lens 1005. The X-Y plane position of the measurement stage 1010 can be detected by measuring a distance to a moving mirror 1011 fixed to the measurement stage 1010 by a laser interferometer 1012. The laser interferometer 1012 detects the position of the measurement stage 1010 and controls a driving unit (not shown), such as a motor, to move the measurement stage 1010 to a predetermined position on the X-Y plane.

An alignment scope 1013 is a microscope to observe an alignment mark (not shown) printed on the wafer 1006 in advance. The alignment mark of the wafer 1006 is observed using the alignment scope 1013 to measure an amount by which the underlying circuit pattern of the wafer 1006 is shifted from the correct position, e.g., a shift amount in an X or Y direction, or a chip magnification error.

Regarding focal plane detection unit 1014 and 1015, the projection optical system 1014 projects a plurality of beams, including non-exposure light, which does not photosensitive the photoresist on the wafer 1006, and the beams focused on and reflected by the wafer 1006 enter the detection optical system 1015. Although not shown, a plurality of position-detection light-receiving elements are arranged in the detection optical system 1015 to correspond to the respective reflected beams. The light-receiving surfaces of the respective position-detection light-receiving elements and the respective beam-reflecting points on the wafer are made substantially conjugate by an image-forming optical system. A positional shift of the wafer surface in the direction of the optical axis of the projection lens 1005 is measured as a positional shift of the incident beam on the position-detection light-receiving element in the detection optical system 1015.

Prior to exposing the wafer 1006 on the exposure stage 1007, on the measurement stage 1010, steps of measuring the various types of shift amounts of the wafer underlying circuit pattern are performed using the alignment scope 1013 and focal plane detection unit 1014 and 1015, to obtain correction amounts, which are used when the wafer 1006 on the exposure stage 1007 is exposed later.

Figure 11:
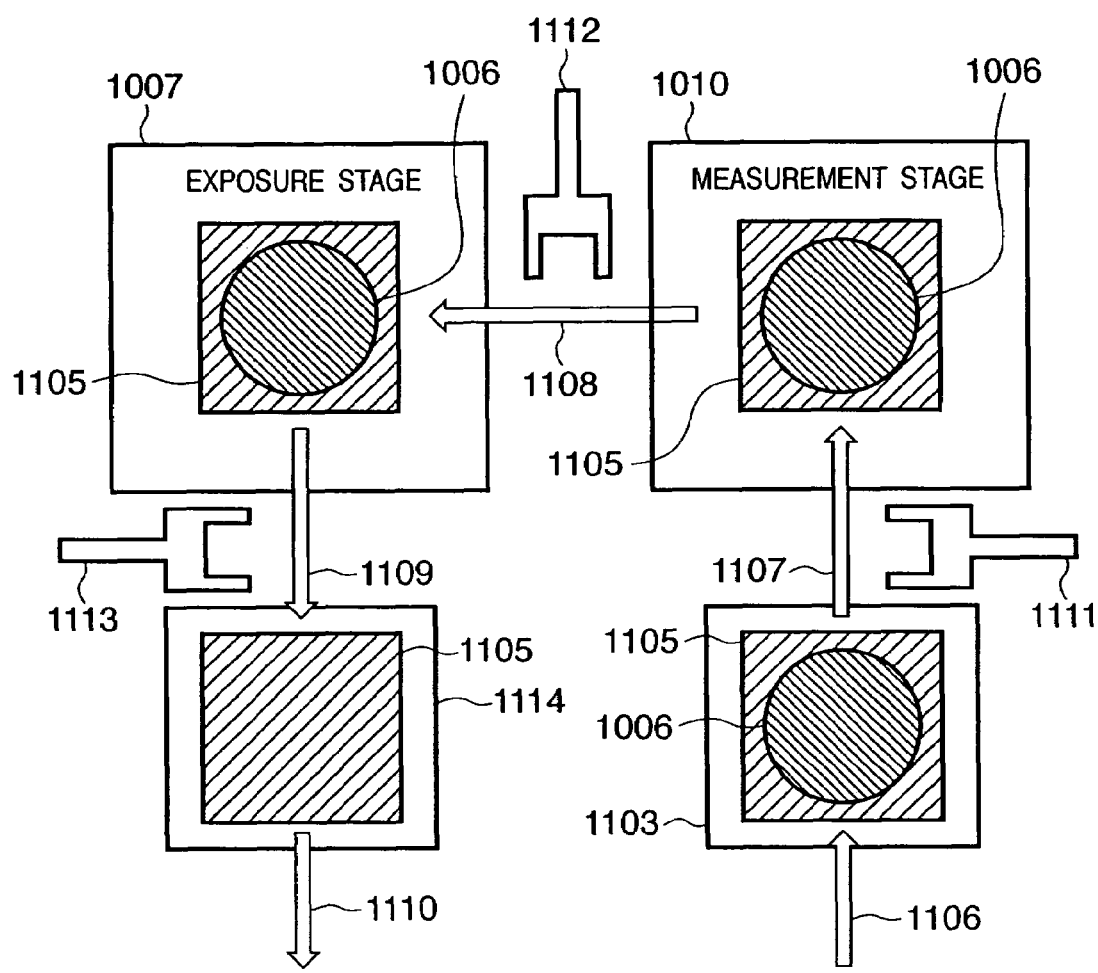
FIG. 11 shows a wafer path according to the second preferred embodiment of the present invention.

FIG. 11 is a schematic view of the twin stage of FIG. 10 seen from above, and shows the flow of the wafer 1006 when a lot process is to be performed. When the wafer 1006 coated with a photosensitive agent is transported to a wafer loading station 1103 by a wafer feeder (not shown) (1106), the wafer 1006 is chucked by a movable chuck 1105. The chucked wafer 1006 is loaded together with the movable chuck 1105 to the measurement stage 101 by a wafer loading hand 1111 serving as a transport device (1107). On the measurement stage 1010, various types of shift amounts of the underlying circuit pattern of the wafer 1006 are measured, as described above.

The measured wafer 1006 is moved together with the movable chuck 1105 to the exposure stage 1007 by the wafer moving hand 1112 (1108). On the exposure stage 1007, step and scan exposure is repeated while correcting the various types of shift amounts of the wafer underlying circuit pattern measured on the measurement stage 1010 in advance. The exposed wafer 1006 is unloaded together with the movable chuck 1105 to a wafer unloading station 1114 by a wafer unloading hand 1113 (1109). The exposed wafer 1006 is released from the movable chuck 1105 and transported by a wafer feeder (not shown) (1110).

Figure 13:
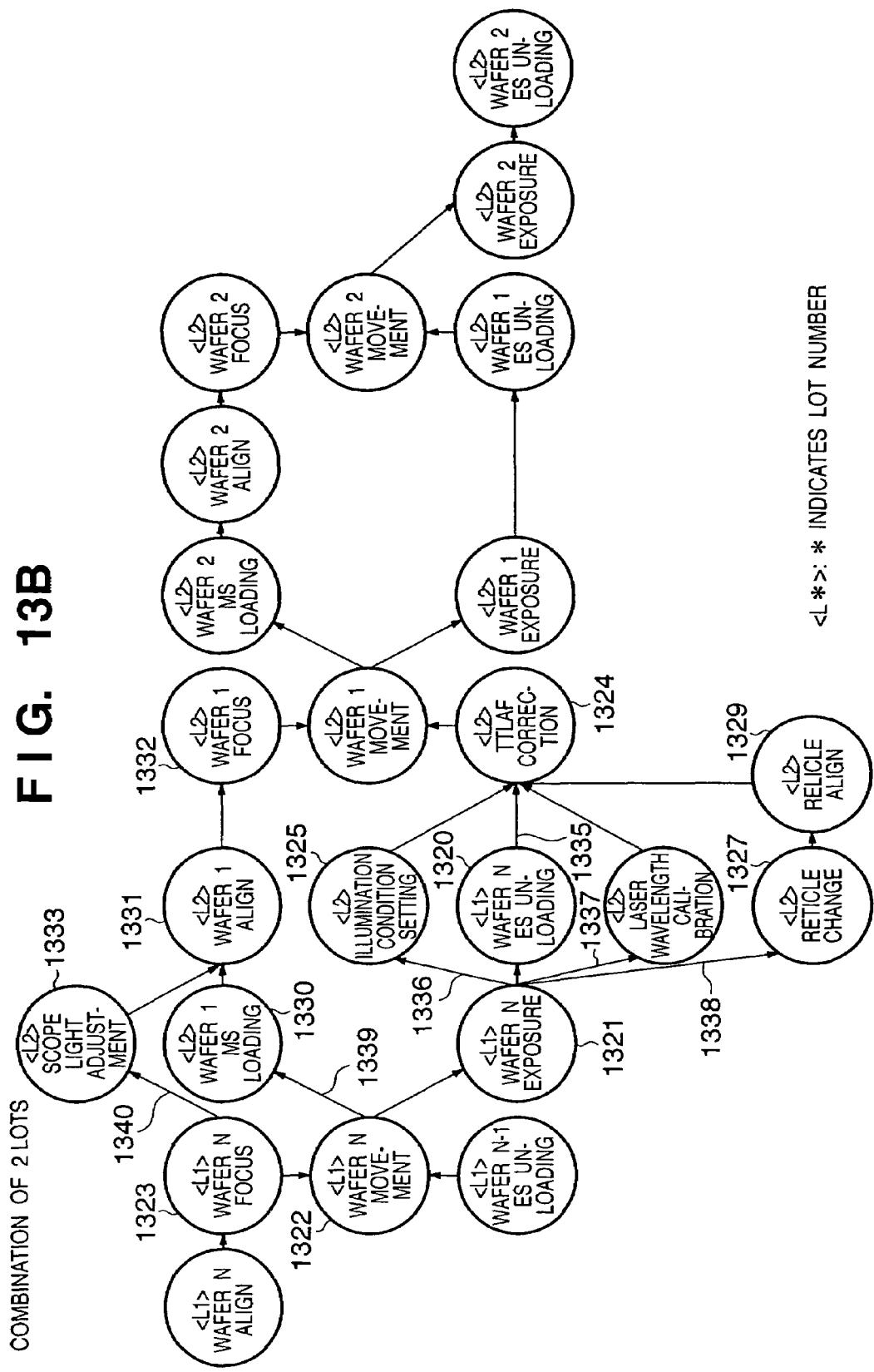
FIGS. 13A and 13B are directed graphs showing step order schedule information according to the second preferred embodiment of the present invention.

Lot step order schedule information of the twin stage exposure apparatus 1000 will be described with reference to FIG. 13A. FIG. 13A shows step order schedule information of a case wherein two wafers of a single-type lot are to be subjected to an exposure process, and is a directed graph in the same manner as that shown in FIG. 9A. When a lot process is started, five steps, i.e., scope light adjustment step 1301 of adjusting the measurement light of the alignment scope and that of the focal plane position detection unit, MS loading step 1302 of loading the first wafer to the measurement stage, illumination condition setting step 1303, a lot processing device preparation step, such as a laser wavelength calibration 1304, and a material transporting step, such as a reticle change step 1305, are started simultaneously. This is because occupied units do not overlap when the respective steps are performed.

On the measurement stage side, when the first wafer is loaded (1302) and scope light adjustment (1301) is performed, wafer alignment 1306 and wafer focus measurement stage 1308 are sequentially performed. On the exposure stage side, exposure preparation for a wafer to be transported is continued. TTLAF correction 1309 of detecting the focal plane of the projection lens 1005 arranged above the exposure stage is performed after steps 1303, 1304, and reticle alignment step 1307 are ended. More specifically, after the lot process is started, wafer preparation, wafer measurement preparation, and a wafer measurement process are performed on the measurement stage side, and exposure preparation steps, such as reticle preparation, apparatus correction, and the like, are performed on the exposure stage side.

The measured wafer, for which steps have been ended until step 1308, is moved by wafer movement 1310 to the exposure stage for which exposure preparation steps until step 1309 have been ended. When wafer movement 1310 is ended, the second wafer is loaded on the measurement stage side (1311). Alignment step 1312 and focus measurement are sequentially performed in the same manner as that for the first wafer. The measured wafer waits until it can be moved to the exposure stage. On the exposure stage side, wherein the wafer has been loaded, the chip region of the wafer is exposed by step and scan (1314). At this time, exposure is performed while correcting the various types of shift amounts of the wafer underlying circuit pattern measured on the measurement stage in advance. After exposure is ended, the exposed wafer is unloaded to the change step (1315). After this, the second measured wafer is moved to the exposure stage (1316) and exposed in the same manner.

Figure 12:
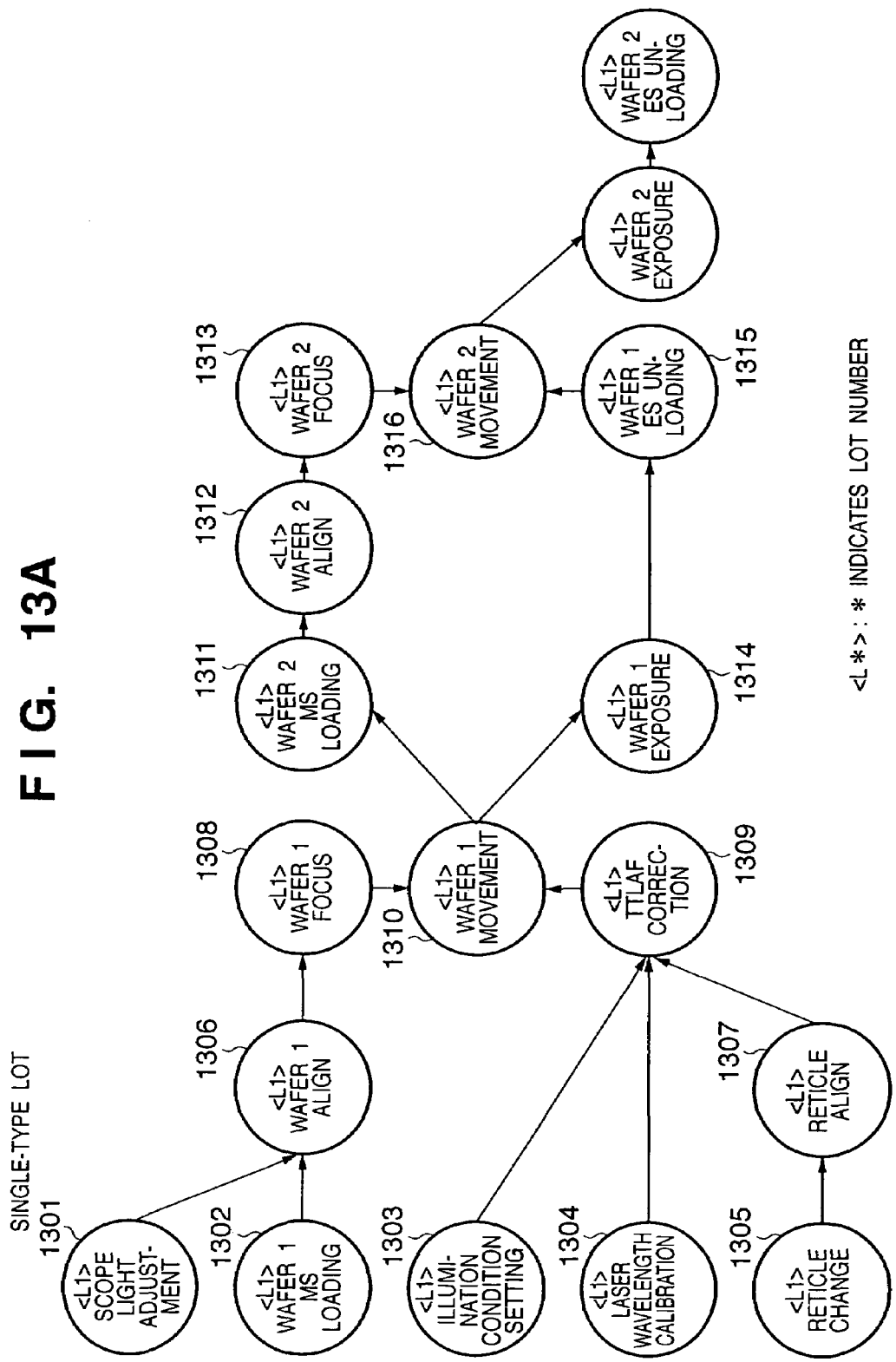
FIG. 12 is a schematic table of step unit occupation information according to the second preferred embodiment of the present invention.

The step combining device 506 shown in FIG. 5 combines two pieces of step order schedule information using the step unit occupation information 509 of the twin stage type exposure apparatus 1000 to suppress a time loss between lots. FIG. 12 shows an example of the step unit occupation information 509 of the twin stage type exposure apparatus 1000. In the table of FIG. 12, step names 1201 are arranged on horizontal rows, and constituent component names (unit names) 1202 are arranged on vertical columns. The unit names shown in the table of FIG. 12 will be compared with views showing the apparatus configuration of FIGS. 10 and 11. Wafer In Station 1203, Reticle Stage 1204, Reticle Changer 1205, Laser 1206, Illumi. System 1207, Wafer Out Hand 1208, Expo Stage 1209, Wafer Xfer Hand 1210, Metro Stage 1211, Wafer In Hand 1212, Alignment Scope 1213, Focus detector 1214, and Wafer Out Station 1215 correspond to the wafer loading station 1103, mask stage 1004, reticle transport unit (not shown), pulse laser source 1001, illumination optical system 1002, wafer unloading hand 1113, exposure stage 1007, wafer moving hand 1112, measurement stage 1010, wafer loading hand 1111, alignment scope 1013, focal plane detection unit 1014 and 1015, and wafer unloading station 1114, respectively. Circles marked in the table of FIG. 12 indicate units occupied when a corresponding step is performed. Information on the units used in the respective steps of the exposure apparatus 1000 can be obtained by referring to the step unit occupation information 509.

FIG. 13B shows an example in which step order schedule information of the two lots are combined with reference to the step unit occupation information 509 of FIG. 12. First, a method of combining the start step of the subsequent lot (second lot) to the previous lot (first lot) will be described. As shown in FIG. 12, last wafer ES unloading step 1320 as the last step of the first lot occupies Wafer Out Station, Wafer Out Hand, and Expo Stage. Similarly, unit occupation information on scope light adjustment 1333, wafer 1 MS loading 1330, illumination condition setting 1325, laser wavelength calibration 1326, and reticle change 1327 as the start steps of the second lot are obtained. The last step of the first lot and each start step of the second lot are compared, and it is checked whether or not units to be occupied overlap. In this case, it is determined that no unit to be occupied overlaps and that the process can accordingly be started before the previous lot is ended. After this, a comparison is made with the unit occupation information of the start step of the second lot while sequentially returning from the last step of the first lot. Scope light adjustment 1333 is combined to the end of last wafer focus measurement 1323 (1340) of the first lot. Wafer 1 MS loading 1330 is combined to the end of the last wafer movement 1322 (1339) of the first lot. Illumination condition setting 1325, laser wavelength calibration 1326, and reticle change 1327 are combined to the end of last wafer exposure 1321 of the first lot (1336, 1337, and 1338).

Subsequently, the last step of the previous lot (first lot) is combined to a subsequent lot (second lot). In the same manner as the combining method described above, occupation unit information of ES unloading step of the last wafer 1320 as the last step of the first lot is sequentially compared with those of the second lot starting with the start step. In the sequential advance of the steps of the second slot, Expo Stage overlaps between ES unloading step 1320 and TTLAF correction step 1324 of the second lot. Thus, step 1320 is combined to the front of step 1324 (1325). The above schedule is performed by the step scheduling device 505. When the operation of the exposure apparatus 1000 is controlled based on the step order schedule information shown in FIG. 13B, scope light adjustment 1333 and wafer loading 1330 of the second lot are started immediately after last wafer measurement 1323 and wafer movement 1322 of the first lot are ended. As a result, a time loss during lot changeover can be decreased greatly.

As has been described above, according to the present invention, when a plurality of product lots are to be processed consecutively, the total process time can be shortened, and semiconductor devices, and the like, can be produced efficiently. In particular, a large effect can be expected in production of many different types of products in small lots. The effect of the present invention appears conspicuously in an exposure apparatus having a twin type wafer stage.

[Application]

Figure 14:
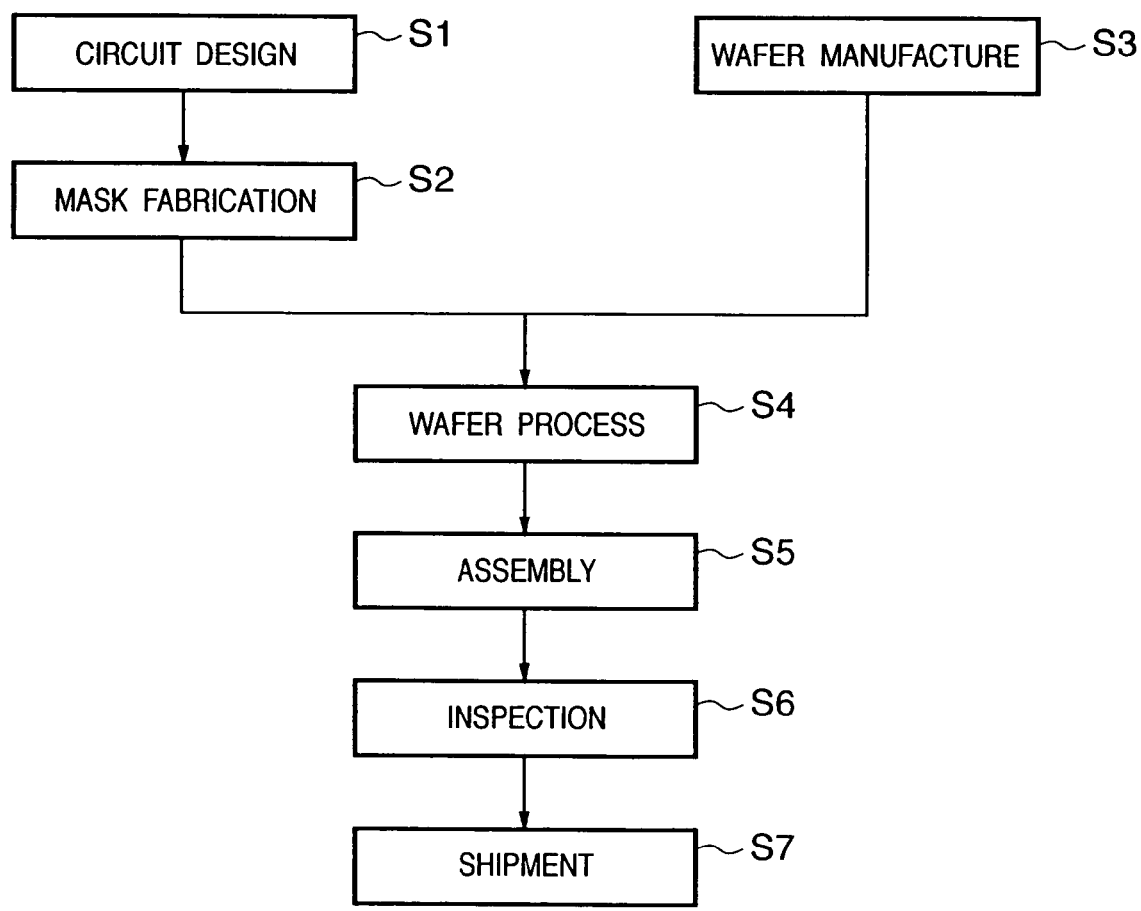
FIG. 14 is a flowchart showing the flow of an entire semiconductor device manufacturing process.

A semiconductor device manufacturing process, which uses the exposure apparatus 100 or 1000 described above, will be described. FIG. 14 is a flowchart showing the flow of the entire semiconductor device manufacturing process. In step 1 (circuit design), the circuit of a semiconductor device is designed. In step 2 (mask fabrication), a mask is fabricated based on the designed circuit pattern.

In step 3 (wafer manufacture), a wafer is manufactured using a material such as silicon. In step 4 (wafer process), called a preprocess, an actual circuit is formed on the wafer by the exposure apparatus described above in accordance with lithography using the mask and wafer described above. In step 5 (assembly), called a post-process, a semiconductor chip is formed from the wafer fabricated in step 4. This step includes processes, such as assembly (dicing and bonding) and packaging (chip encapsulation). In step 6 (inspection), inspections such as an operation check test and a durability test of the semiconductor device fabricated in step 5, are performed. A semiconductor device is finished with these steps and is shipped, in step 7.

The wafer process of step 4 has the following steps, i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of transferring the circuit pattern to the wafer after the resist process step by the exposure apparatus described above, a developing step of developing the wafer exposed in the exposure step, an etching step of removing portions other than the resist image developed in the developing step, and a resist removal step of removing an unnecessary resist after etching. These steps are repeated to form multiple circuit patterns on the wafer.

The exposure apparatus is not limited to those described above. Any exposure apparatus will do as far as it is used to manufacture devices having fine patterns, e.g., semiconductor devices, such as a semiconductor integrated circuit, a micromachine, and a thin-film magnetic head, and forms a desired pattern on a substrate by irradiating, through a mask or reticle as an original, a semiconductor wafer W as the substrate with exposure light (this term is a generic term for visible light, ultraviolet light, EUV light, X-rays, an electron beam, a charged particle beam, or the like) serving as exposure energy from a light source through a projection lens (this is a generic term for a dioptric lens, a reflecting lens, a cata-dioptric lens system, a charged particle lens, or the like), serving as a projection system. Alternatively, the exposure apparatus can be of a type which directly draws a circuit pattern on a semiconductor wafer without using a mask and exposes a resist.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-106358 filed on Mar. 31, 2004, which is hereby incorporated by reference herein.

What is claimed is:

1. An exposure apparatus having a plurality of units and being configured to expose a substrate to a pattern, said apparatus comprising:
   a scheduling unit configured to schedule a process step with respect to each lot of the substrate;
   a combining unit configured to combine process steps of first and second lots of the substrate, to be processed consecutively, with respect to which said scheduling unit has scheduled process steps; and
   a control unit configured to control said plurality of units based on the combined process steps,
   wherein said combining unit is configured to combine the process steps such that before completion of a process of the first lot, one of said plurality of units, which completes a process of the first lot, starts a preprocess concerning the second lot, the preprocess including at least one of a process of changing a reticle for forming the pattern, a process of adjusting said one of said plurality of units, a process of setting a condition of said one of said plurality of units, a process of calibrating said one of said plurality of units, a process of setting a correction parameter of said one of said plurality of units, and a process of aligning the reticle.

2. An apparatus according to claim 1, wherein said scheduling unit is configured to schedule the process step based on recipe data concerning a lot and data indicating a unit to be used in each process step concerning the recipe data.

3. An apparatus according to claim 2, further comprising a receiving unit configured to receive the recipe data through a network.

4. An apparatus according to claim 1, wherein said combining unit is configured to combine the process steps based on data indicating a unit to be used in each process step.

5. An apparatus according to claim 1, further comprising a measurement stage in which a substrate included in each lot is measured and an exposure stage in which a substrate measured at said measurement stage is exposed to the pattern.

6. A method of manufacturing a device, said method comprising steps of:
   exposing a substrate to a pattern using an exposure apparatus as defined in claim 1;
   developing the exposed substrate; and
   processing the developed substrate to manufacture the device.

7. A device manufacturing method of manufacturing a device using an exposure apparatus having a plurality of units and being configured to expose a substrate to a pattern, said method comprising steps of:

scheduling a process step with respect to each lot of the substrate;

combining process steps of first and second lots of the substrate, to be processed consecutively, with respect to which said scheduling step has scheduled process steps; and controlling the plurality of units based on the combined process steps, wherein said combining step combines the process steps such that before completion of a process of the first lot by the exposure apparatus, one of the plurality of units, which completes a process of the first lot, starts a preprocess concerning the second lot, the preprocess including at least one of a process of changing a reticle for forming the pattern, a process of adjusting the one of the plurality of units, a process of setting a condition of the one of the plurality of units, a process of calibrating the one of the plurality of units, a process of setting a correction parameter of the one of the plurality of units, and a process of aligning the reticle.

8. A method according to claim 7, wherein said scheduling step schedules the process step based on recipe data concerning a lot and data indicating a unit to be used in each process step concerning the recipe data.

9. A method according to claim 6, further comprising a step of receiving the recipe data through a network.

10. A method according to claim 7, wherein said combining step combines the process steps based on data indicating a unit to be used in each process step.

11. A method according to claim 7, wherein the exposure apparatus comprises a measurement stage in which a substrate included in each lot is measured and an exposure stage in which a substrate measured at the measurement stage is exposed to the pattern.

* * * * *

UNITED STATES PATENT AND TRADEMARK OFFICE
CERTIFICATE OF CORRECTION

PATENT NO. : 7,127,311 B2
APPLICATION NO. : 11/091595
DATED : October 24, 2006
INVENTOR(S) : Hiromi Kemmoku It is certified that error appears in the above-identified patent and that said Letters Patent is hereby corrected as shown below:

COLUMN 5:
    Line 56, "607 of" should read -- 608 of --.

COLUMN 6:
    Line 19, "100 stars" should read -- 100 starts --.

COLUMN 9:
    Line 55, "slot," should read -- lot, --.

COLUMN 10:
    Line 26, "state 1007," should read -- stage 1007, --.
    Line 49, "photosensitive" should read -- photosensitize --.

COLUMN 14:
    Line 4, "cata-dioptric" should read -- catadioptric --.

COLUMN 16:
    Line 9, "claim 6," should read -- claim 8, --.

Signed and Sealed this

Tenth Day of April, 2007

JON W. DUDAS
*Director of the United States Patent and Trademark Office*